United States Patent [19]
Bhatt et al.

[11] Patent Number: 5,827,386
[45] Date of Patent: Oct. 27, 1998

[54] METHOD FOR FORMING A MULTI-LAYERED CIRCUITIZED SUBSTRATE MEMBER

[75] Inventors: Ashwinkumar Chinuprasad Bhatt, Endicott; Mark Daniel Derwin, Binghamton; Kenneth John Lubert, Endicott, all of N.Y.

[73] Assignee: International Business Machines Corporation, Armonk, N.Y.

[21] Appl. No.: 665,184

[22] Filed: Jun. 14, 1996

[51] Int. Cl.⁶ .................................................. H05K 3/36
[52] U.S. Cl. ............................................. 156/150; 427/97
[58] Field of Search .................................. 156/150, 151; 427/97

[56] References Cited

U.S. PATENT DOCUMENTS

| | | | |
|---|---|---|---|
| 3,999,004 | 12/1976 | Chirino et al. | 174/68.5 |
| 4,263,341 | 4/1981 | Martyniak | 427/97 |
| 4,292,230 | 9/1981 | Kenney et al. | 260/33.2 |
| 4,479,983 | 10/1984 | Appelt et al. | 427/54.1 |
| 4,644,130 | 2/1987 | Bachmann | 219/121 |
| 4,663,208 | 5/1987 | Ninomiya et al. | 428/138 |
| 4,791,248 | 12/1988 | Oldenettel | 174/68.5 |
| 5,185,209 | 2/1993 | Zupancic | 428/457 |
| 5,185,210 | 2/1993 | Zupancic | 428/457 |
| 5,366,846 | 11/1994 | Knudsen et al. | 430/280 |
| 5,372,666 | 12/1994 | Kawasaki | 156/89 |
| 5,487,218 | 1/1996 | Bhatt et al. | 29/852 |

FOREIGN PATENT DOCUMENTS 06-326217  11/1994  Japan .

*Primary Examiner*—Francis J. Lorin
*Attorney, Agent, or Firm*—Ratner & Prestia; Lawrence R. Fraley

[57] ABSTRACT

The ends of thru-holes, disposed in components that are laminated together to form a composite structure are masked prior to lamination of the components to prevent bonding material bleed through the holes during the lamination process. The method effectively solves the problem of the need to remove laminate bleed from the outer surface of the composite structure after the joining process.

5 Claims, 4 Drawing Sheets

METHOD FOR FORMING A MULTI-LAYERED CIRCUITIZED SUBSTRATE MEMBER

BACKGROUND OF THE INVENTION

1. Technical Field

This invention relates generally to a method of forming laminated electrical circuit members such as circuit boards, and more particularly to such a method that avoids removal of bonding material that may extrude through thru-holes during lamination.

2. Background Art

When laminating multiple components into composite structures, the bonding material, such as pre-preg epoxy sticker sheets, often flows through drilled and plated holes extending through the components and onto an external surface of the composite structure. This condition is referred to as "epoxy bleed." Before the composite structure can be further processed or circuitized, the bleed must be removed. The processes for bleed removal, used today, affect the external surface of the composite structure, making additional processing difficult or impossible. For example, an optical inspection test cannot be performed on a surface that is irregular or marred as a result of scratches produced during bleed removal.

The present invention is directed to overcoming the problems set forth above. It is desirable to have an effective method by which a composite structure can be formed by laminating components having plated thru-holes without requiring the removal of lamination material bleed from around the plated thru-hole openings. It is also desirable to have such a method that is readily adaptable to existing manufacturing processes and does not adversely affect the structural integrity of the laminated composite structure.

SUMMARY OF THE INVENTION

In one aspect of the present invention, a method of forming a multi-layered circuitized substrate member includes forming a first laminated component having a plurality of electrical circuits defined therein and at least one hole extending through the component. The method further includes forming a second laminated component having the same characteristics as the first laminated component. A selected end of each of the holes extending through the first and the second components is masked prior to laminating the first and second components and forming a composite structure in which the masked ends of the thru-holes are internally disposed in the composite structure. The method also includes forming at least one electrical circuit connection site on a selected external surface of the composite structure.

Other features of the method of forming a multi-layered circuitized substrate member includes masking the selected end of each of the thru-holes with a dry film solder masking material or, alternatively, disposing a layer of the dry film solder masking material over the entire surface onto which the selected holes open. Other features of the method of forming a multi-layered circuitized substrate member include masking the selected end of each of the holes extending through the first and second members with a coating of an epoxy material and subsequently curing the epoxy material prior to lamination of the first and second components together to form a composite structure.

DETAILED DESCRIPTION OF A PRESENTLY PREFERRED EXEMPLARY EMBODIMENT

Figure 1:
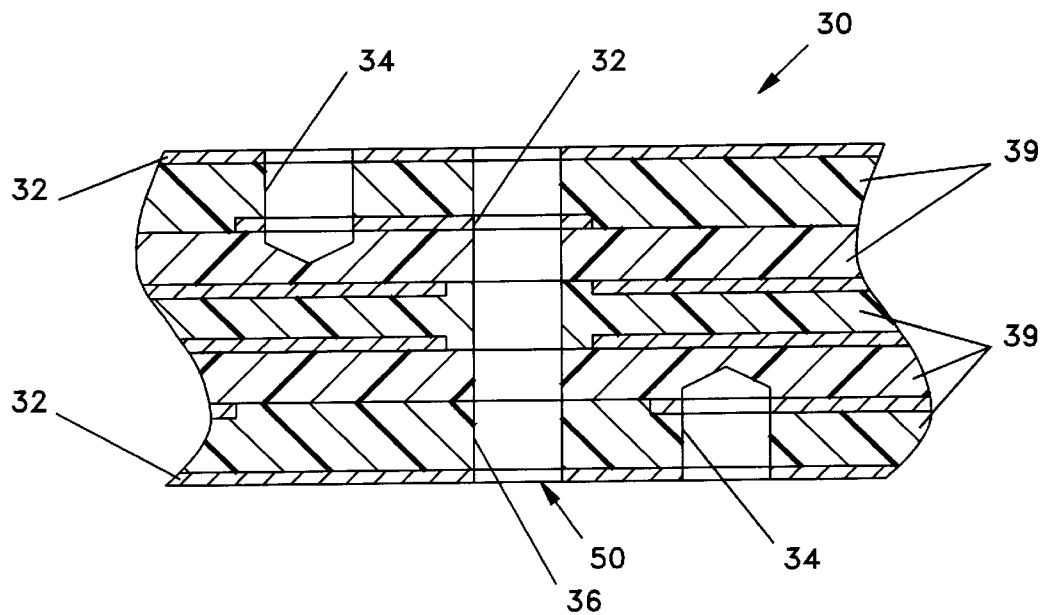
FIG. 1 is a cross-sectional view of a first laminated component formed in accordance with the method embodying the present invention.
Figure 5:
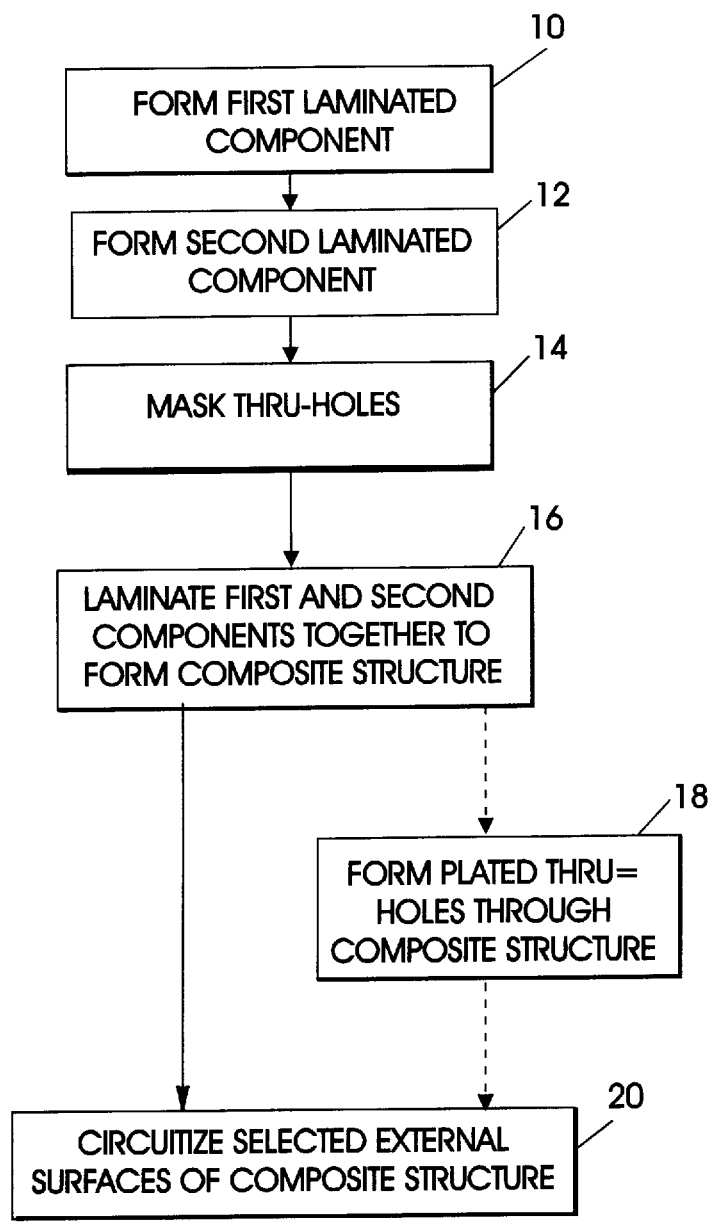
FIG. 5 is a flow chart representing the principal steps carried out in the method of forming a multi-layered circuitized substrate member in accordance with the present invention.

A method of forming a multi-layered circuitized substrate member, in accordance with the present invention, includes initially providing a first laminated component having a plurality of electrical circuits defined therein and at least one hole extending through the component, and a similar second laminated component, as represented by blocks 10, 12, in FIG. 5. A suitable first laminated component, identified by the reference numeral 30 in FIG. 1, is shown at an intermediate step in its formation. The fabrication of such laminated components is well known in the art, and the various steps involved in the manufacture will not be repeated herein, for the sake of conciseness. As can be seen, the first laminated component 30 includes a plurality of circuitized signal planes 32, a pair of blind vias 34, a thru-hole 36 extending through the laminated component 30, and a plurality of dielectric separator layers 39.

The second laminated component 40 is shown at a later stage of fabrication, and includes a plurality of circuitized signal planes 42, a pair of bind vias 44, a thru-hole 46, and a plurality of dielectric layers 49. At this stage of fabrication, the surface signal planes 42, the blind vias 44, and the thru-hole 46 are plated and etched.

Figure 2:
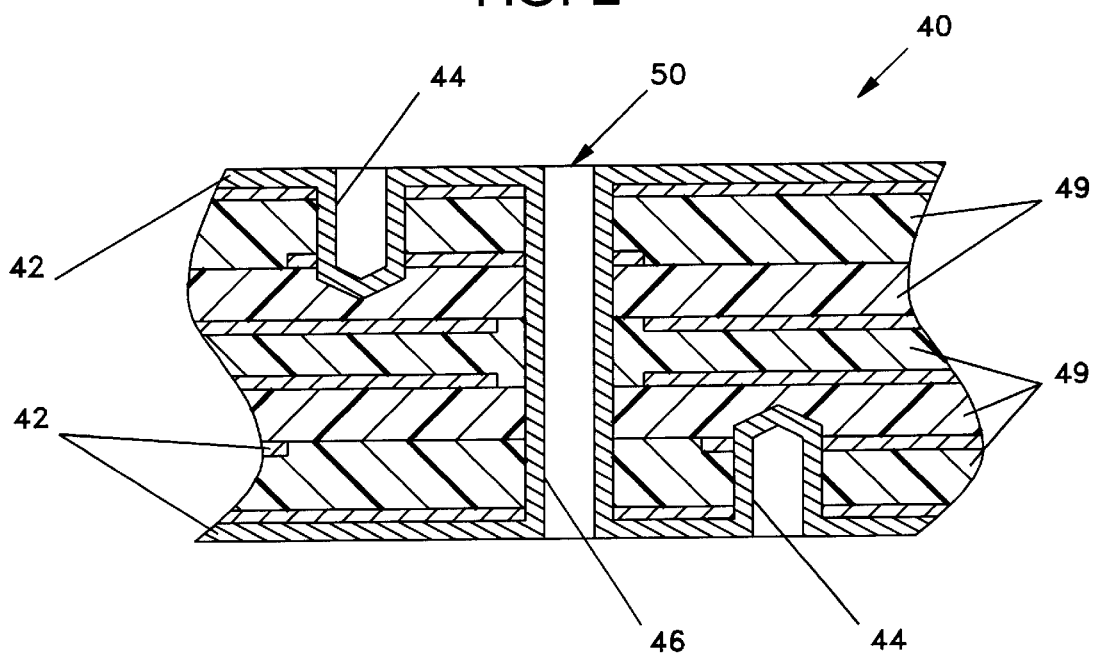
FIG. 2 is a cross-sectional view of a second laminated component formed in accordance with the method embodying the present invention.
Figure 3:
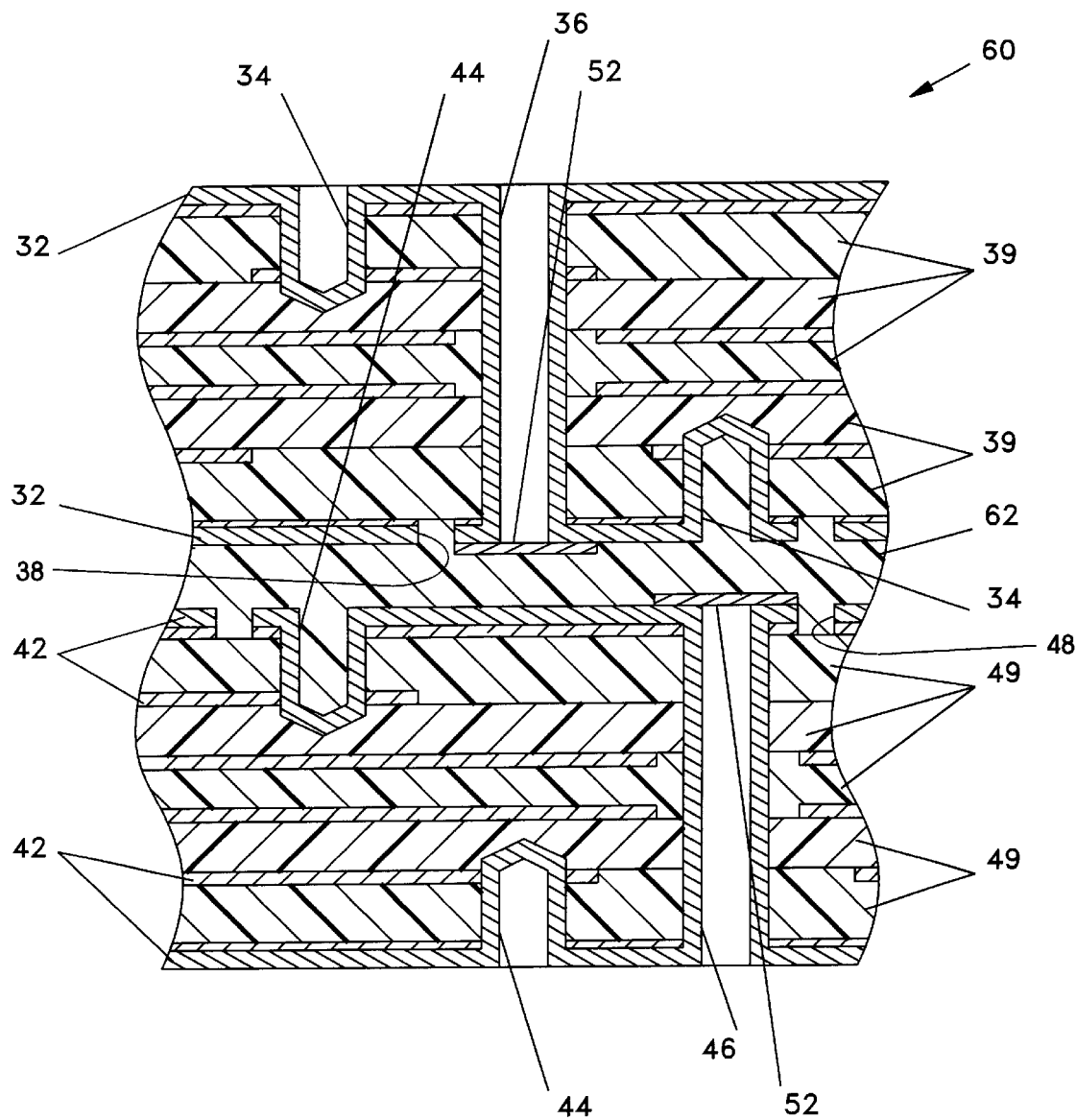
FIG. 3 is a cross-sectional view of a composite structure formed in accordance with the method embodying the present invention.

After fabrication of both the first and second laminated components 30, 40 to a completion state as represented by the second laminated component 40 in FIG. 2, the internal ends of the plated thru-holes 36, 46 are masked, as indicated at block 14 in FIG. 5. In the preferred embodiment, the internal ends of the plated thru-holes 36, 46, identified by the reference number 50 in FIGS. 1 and 2, are covered with a dry film solder mask material 52, such as IBM's advanced solder mask ASM™. The placement of the dry film solder mask 52 over the internal ends 50 of the component thru-holes 36, 46, is shown in the cross-section of the composite structure 60 in FIG. 3.

Alternatively, the internal ends 50 of the plated thru-holes 36, 46, which typically may have a diameter of from about 10 to about 14 mils, may comprise a curable epoxy such as Epoxy 240, produced by Westinghouse. This material is advantageously applied by screen coating and has a surface tension sufficient to span the relatively small diameter opening of the thru-holes. The epoxy is then cured to form a solid wall across the thru-hole ends 50 prior to proceeding with the lamination of the first and second components 30, 40 to form a multi-layered circuitized substrate member represented by the composite structure 60 shown in FIGS. 3 and 4.

In another alternative arrangement, the dry film solder mask may be disposed over the entire internal surfaces of the first laminated component 30 and second laminated component 40 prior to joining to form the composite structure 60. However, in this arrangement, the film must be removed from the openings of the plated blind vias 34, 44 that will be internally disposed when the composite structure is formed. Also, a number of spaces 38, 48 are formed during formation of surface disposed circuits on the components 30, 40. It is desirable to fill the shallow spaces 38, 48 by extruding the laminate bonding material into the spaces 38,48 during lamination of the components 30, 40 together to form the composite structure 60.

The preformed and masked first and second laminated components 30, 40 are then joined together to form the composite structure 60, as represented at block 16 in FIG. 5. Preferably a lamination material 62, commonly referred to as a sticker sheet, such as Epoxy 13, a partially cured epoxy, is placed between the internally disposed facing surfaces of the respective components 30, 40. The assembled structure is then placed in a press in which the structure is heated under applied pressure whereby the epoxy bonding material 62 is heated to a flowable temperature, thereby permitting the bonding material 62 to flow into the shallow blind vias 34, 44 and into the shallow signal plane voids 38, 48.

Figure 4:
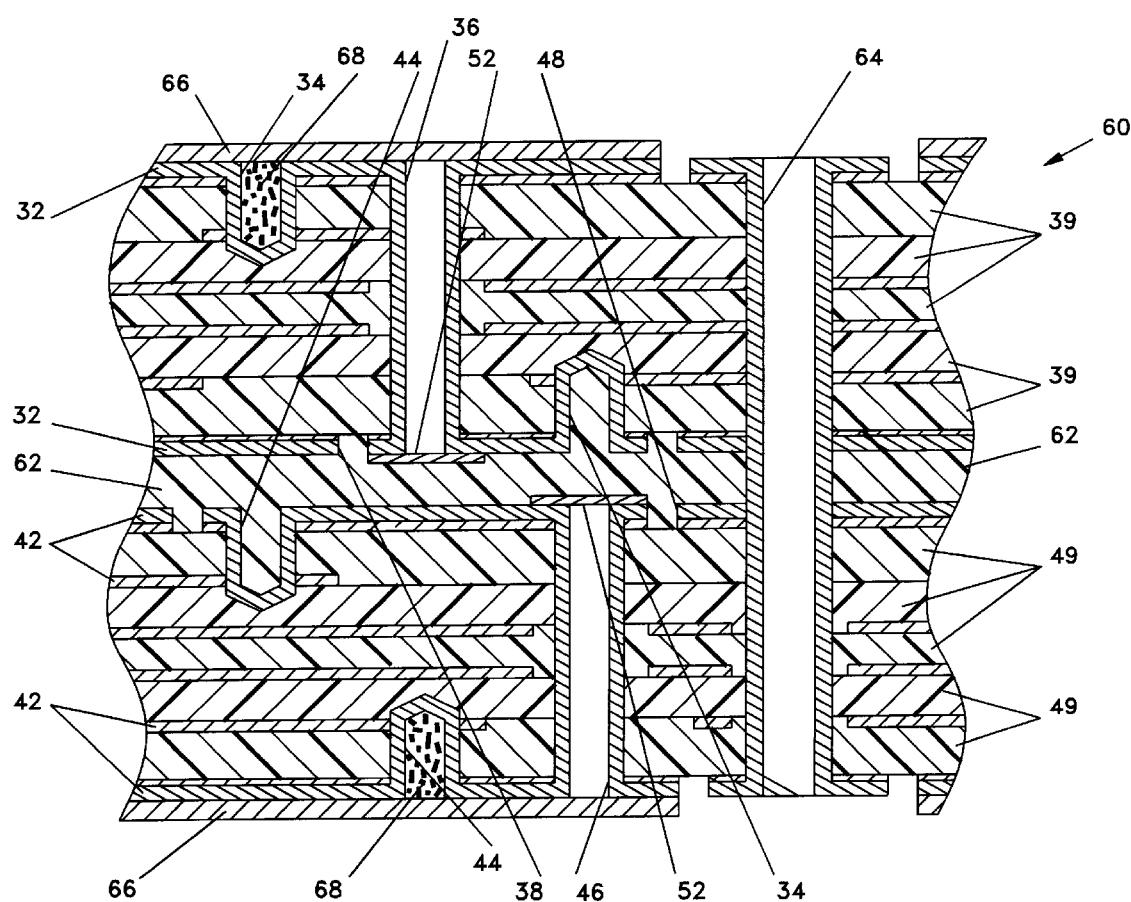
FIG. 4 is a cross-sectional view of the composite structure formed in accordance with the method embodying the present invention, with circuit layers and a plated thru-hole formed subsequent to lamination.

After lamination of the components 30, 40 to form the composite structure 60, plated thru-holes 64 extending between the outer surfaces of the composite structure 60, are formed, if required as optionally represented by block 18 in FIG. 5, and shown in the cross-section of the structure 60 in FIG. 4. The plated thru-holes 64 are formed by drilling through the composite structure 60, and then plated, such as by an additive or an acid copper plate process. Although not necessary, it is desirable, prior to plating over the vias 34,44 disposed on the external surfaces of the composite structure 60 to provide circuit connection sites, that the externally disposed vias 34,44 be filled, preferably with a solder paste 68.

External circuit connection sites 66, such as mounting pads for electrical modules, chips, or other components, and further definition of electrical circuits, may now be formed, as represented at block 20 in FIG. 5, typically by either electrolytic or electroless plating with gold, or other conductive metal.

Importantly, by masking the internally disposed ends of thru-holes 36, 46 extending through the respective first and second components 30, 40 prior to lamination of the preformed components 30, 40 to form the composite structure 60, the problem of laminate bleed through the holes 36, 46 during lamination is avoided. By preventing epoxy bleed, the laminating material does not require removal from surface areas surrounding the external ends of the holes 36, 46. Not only is removal of cured epoxy difficult, but generally results in damage to the external surface of the composite structure 60 to such an extent that it hinders optical inspection of the surface. Also, if the extruded lamination material extends over exterior surface areas that are to be subsequently plated, the laminate material must be removed from those areas as well. As can be readily seen, the present invention provides an economical and effective method for preventing the flow of laminate bonding material through thru-holes during the joining of separate components to form a composite multi-layered circuitized substrate member 60.

Although the present invention is described in terms of a presently preferred embodiment, those skilled in the art will recognize that changes in the specific arrangement or number of circuit planes 32, 42, and in the overall construction of the first and second components, may vary from that shown as examples, without departing from the spirit of the invention. Such changes are intended to fall within the scope of the following claims. Other aspects, features, and advantages of the present invention may be obtained from a study of this disclosure, along with the appended claims.

What is claimed is:

1. A method of forming a multi-layered circuitized substrate member, comprising:

forming a first laminated component having a plurality of electrical circuits defined therein and at least one unfilled hole extending through said first component;

forming a second laminated component having a plurality of electrical circuits defined therein and at least one unfilled hole extending through said second component;

masking a selected end of each of said holes extending through said first and second components;

laminating said first and second components and thereby forming a composite structure wherein said masked ends of the unfilled holes of the first and second components are internally disposed in said composite structure; and forming at least one electrical circuit connection site on selected external surfaces of said composite structure.

2. A method of forming a multi-layered circuitized substrate member, as set forth in claim 1, wherein said masking said selected end of each of said holes extending through said first component and said second component includes laminating a dry film solder masking material over the opening formed by each of said selected hole ends with the surrounding surface of the respective component.

3. A method of forming a multi-layered circuitized substrate member, as set forth in claim 2, wherein said dry film solder mask is laminated over the entire surface of each of said components onto which said selected hole ends open.

4. A method of forming a multi-layered circuitized substrate member, as set forth in claim 1, wherein said masking said selected end of each of said holes extending through said first and said second components includes:

coating the opening formed by each of said selected hole ends with an epoxy material; and curing said epoxy material prior to laminating the first and second components together to form a composite structure.

5. A method of forming a multi-layered circuitized substrate member, as set forth in claim 1, wherein said method includes, subsequent to laminating said first and second components together and forming a composite structure, drilling at least one hole through said composite structure, and plating said drilled hole.

\* \* \* \* \*